(12) United States Patent  (10) Patent No.: US 7,315,450 B2
Ishii et al.  (45) Date of Patent: Jan. 1, 2008

(54) HEAT-GENERATING COMPONENT COOLING STRUCTURE

(75) Inventors: Hideo Ishii, Osaka (JP); Masao Katooka, Osaka (JP); Kazunori Nakata, Osaka (JP); Yuji Ikejiri, Osaka (JP)

(73) Assignee: Sansha Electric Manufacturing Company, Limited, Osaka (JP)

( * ) Notice: Subject to any disclaimer, the term of this patent is extended or adjusted under 35 U.S.C. 154(b) by 231 days.

(21) Appl. No.: 11/218,151

(22) Filed: Aug. 31, 2005

(65) Prior Publication Data

US 2005/0286226 A1 Dec. 29, 2005

(51) Int. Cl.
*H05K 7/20* (2006.01)

(52) U.S. Cl. .................. 361/704; 361/699; 361/707; 361/709; 165/80.3; 165/185; 174/16.3

(58) Field of Classification Search ............... None
See application file for complete search history.

(56) References Cited

U.S. PATENT DOCUMENTS

| | | | | |
|---|---|---|---|---|
| 3,149,666 A | * | 9/1964 | Coe ........................... | 165/121 |
| 3,277,346 A | * | 10/1966 | McAdam et al. ........... | 361/697 |
| 3,566,959 A | * | 3/1971 | Koltuniak et al. ......... | 165/80.3 |
| 4,833,766 A | * | 5/1989 | Herrell et al. ........... | 29/890.03 |
| 5,828,549 A | * | 10/1998 | Gandre et al. ............. | 361/695 |
| 5,909,358 A | * | 6/1999 | Bradt ......................... | 361/707 |
| 5,926,367 A | * | 7/1999 | Gutierrez et al. ........... | 361/695 |
| 5,940,272 A | * | 8/1999 | Emori et al. ................ | 361/704 |
| 5,946,188 A | * | 8/1999 | Rochel et al. .............. | 361/690 |
| 6,397,926 B1 | * | 6/2002 | Sato et al. .................. | 165/80.3 |
| 6,478,082 B1 | * | 11/2002 | Li ............................... | 165/185 |
| 6,580,608 B1 | * | 6/2003 | Searls et al. ................ | 361/690 |
| 6,740,968 B2 | * | 5/2004 | Matsukura et al. ......... | 257/707 |
| 6,992,890 B2 | * | 1/2006 | Wang et al. ................ | 361/700 |
| 7,148,452 B2 | * | 12/2006 | Peterson et al. ......... | 219/443.1 |
| 7,191,822 B2 | * | 3/2007 | Huang et al. .............. | 165/80.3 |
| 2003/0123227 A1 | * | 7/2003 | Chin-Wen ................... | 361/697 |

FOREIGN PATENT DOCUMENTS

JP 2003-244958 8/2003

* cited by examiner

*Primary Examiner*—Boris Chervinsky
(74) *Attorney, Agent, or Firm*—Duane Morris LLP

(57) ABSTRACT

A heat-generating component cooling structure includes a hollow heat sink having a portion made of a thermally conductive material. The heat sink has an interior path extending from first to second ends of the heat sink. A fan device is disposed at the first end of the heat sink and is adapted to cause air to flow through the interior path. Fins are disposed in the path in the heat sink. Heat-generating components of an electrical circuit are mounted on an outer surface of the heat sink.

6 Claims, 5 Drawing Sheets

HEAT-GENERATING COMPONENT COOLING STRUCTURE

This invention relates to a cooling structure for a heat-generating component.

BACKGROUND OF THE INVENTION

A power supply apparatus, an electronic load device (active dummy load) and the like include a number of electric components. Some of such electric components generate a large amount of heat when supplied with current thereto. Hereinafter, such components are referred to as heat-generating components. It is desirable for heat-generating components to be cooled. An example of useable cooling techniques is a forced air cooling method. An example of power supply apparatuses employing a forced air cooling technique is disclosed in JP 2003-244958 A. The power supply apparatus disclosed in JP 2003-244958 A includes a rectangular-parallelepiped-shaped heat sink having two side surfaces to which first and second plate-shaped chassis are attached. Each of the chassis has a window therein. A semiconductor module, which is a heat-generating component, is mounted on the heat sink in such a manner as to protrude through each of the windows in the first and second chassis. On the surface of each of the first and second chassis opposite to the surface contacting the heat sink, a printed circuit board is disposed with a spacing disposed from the heat sink. The semiconductor modules are electrically connected to the printed circuit boards by means of connection terminals of the respective semiconductor modules. The heat sink, the first and second chassis, and the printed circuit boards form a block. The block has its lateral side covered by a case, and its front and rear sides are covered by front and rear panels, respectively. A fan, which feeds air, is mounted on the block on the rear panel side thereof. The first and second chassis on the opposite sides of the heat sink form, therebetween, a path for air cooling the semiconductor modules. The connection terminals on the semiconductor modules are located between the first chassis and the associated printed circuit board and between the second chassis and the associated printed circuit board, respectively, and are exposed to external air sucked in by the fan.

The connection terminals of the semiconductor modules of this power supply apparatus are adversely affected by undesirable components, if any, in external air sucked into the interior of the power supply apparatus, and, therefore, insulation of the semiconductor modules would be degraded. To prevent it, the semiconductor modules are so disposed that the insulation distance can be larger. However, when such power supply apparatus is used in electroplating, it will be in an environment in which a mist of liquid generated from a plating bath tank is flowing, and, therefore, even with a large insulation distance held, air containing the plating liquid mist should contact the connection terminals of the semiconductor modules, whereby the insulation is degraded. this could lead to failure of the modules. When the power supply apparatus is used in welding, it will be placed in an environment where electrically conductive dust and particles, such as iron particles, are floating. Such conductive particles would be sucked into the interior of the power supply apparatus, accumulate over the connection terminals of the semiconductor modules, and cause current leakage, which could lead to failure of the semiconductor modules.

An object of the present invention is to provide a cooling structure for a heat-generating component to prevent the heat-generating component from being broken down even when it is used in an environment tending to cause failure of such component.

SUMMARY OF THE INVENTION

A cooling structure for a heat-generating component according to the present invention includes a hollow heat sink having a portion made of a thermally conductive material. The hollow heat sink has an interior path formed therein which extends from first to second ends of the heat sink. A fan is disposed to face the first end of the heat sink, being in contact with or spaced therefrom. A heat-generating component of an electrical circuit is mounted on a portion other than the interior path in the heat sink, e.g. on an outer surface of the heat sink. It is desirable to form fins on the walls of the interior path of the heat sink. Also, it is desirable to form a layer of an oxide of stain-preventing metal, e.g. titanium, on the walls of the interior path.

The cooling structure desirably is housed in a case. The case has ventilation openings in the portions facing the first and second ends of the hollow heat sink. The heat-generating component may have an electrically conductive portion for feeding power to the heat-generating component, e.g. a connection terminal. In such case, the electrically conductive portion is disposed on the outer surface of the heat sink.

Part of the heat sink may be a printed circuit board. In such case, the heat-generating component is disposed on the outer surface of the printed circuit board.

DESCRIPTION OF PREFERRED EMBODIMENTS

Figure 1:
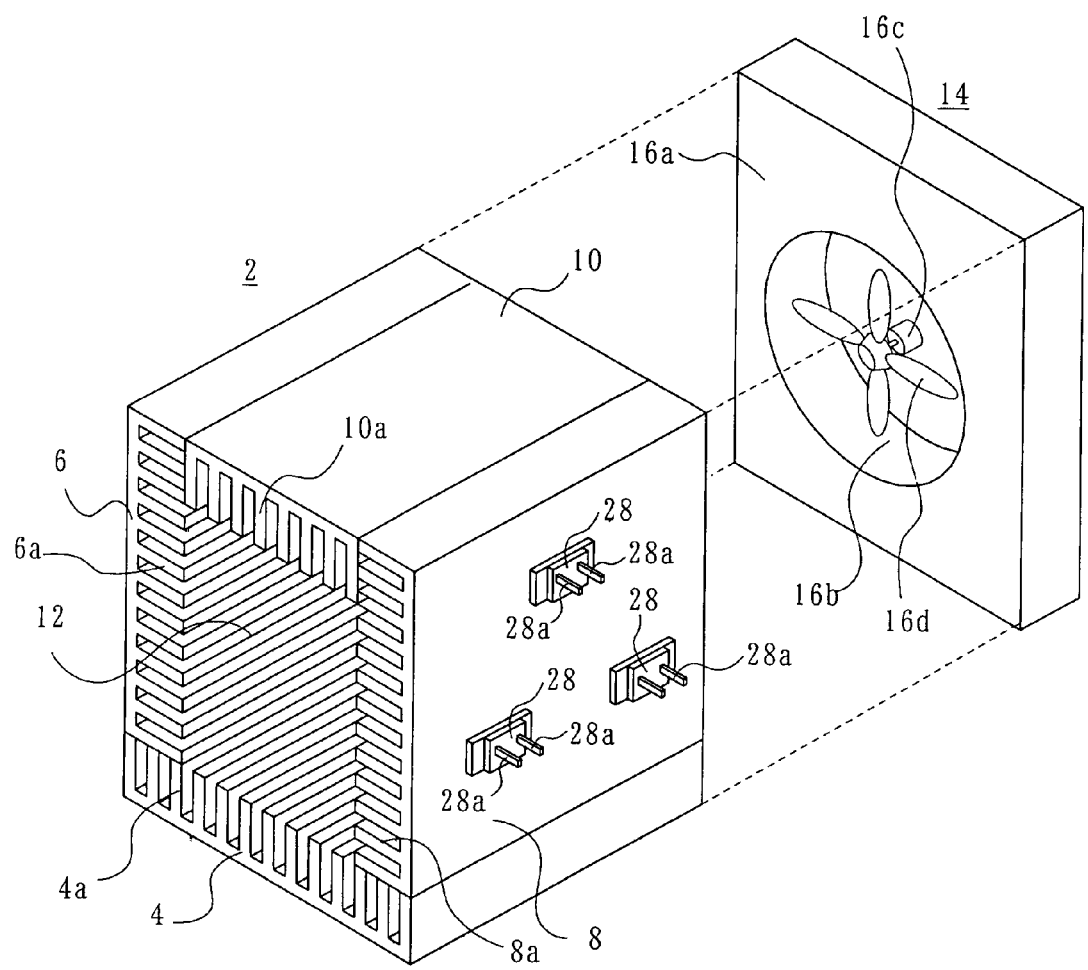
FIG. 1 is a perspective view of a heat-generating component cooling structure according to a first embodiment of the present invention.

As shown in FIG. 1, a heat-generating component cooling structure according to a first embodiment includes a hollow heat sink 2. The heat sink 2 includes a plurality of heat conductive material members combined to form a heat sink having a polygonal cross-section. For example, four metal plate members 4, 6, 8 and 10 are disposed perpendicular to each other into a rectangular-parallelepiped-shaped heat sink 2, with adjacent plate members secured to each other by means of any suitable securing members (not shown). The heat sink 2 has a path 12 formed in it, which extends between and opening at two opposed ends, e.g. front and rear end portions. The plate members 4, 6, 8 and 10 have a number of fins 4a, 6a, 8a and 10a, respectively, formed on their surfaces facing the path 12. The respective fins extend in the length direction of the path 12. The metal plate members 4, 6, 8 and 10 may be formed by, for example, drawing aluminum.

In the rear portion of the heat sink 2, a fan device 14 is disposed with a spacing disposed from the rear surface of the heat sink 2. The fan device 14 includes a rectangular-parallelepiped-shaped frame 16a, which is flatter than the heat sink 2. The peripheral edges of the front side of the frame 16a are shaped to be conformable with the peripheral edges of the rear surface of the heat sink 2. A circular opening 16b is formed in a central portion of the frame 16a and extends through the frame 16a between the front and rear surfaces thereof. The longitudinal center axis of the circular opening 16b and that of the path 12 coincide with each other. The diameter of the circular opening 16b is equal to the width of the path 12, i.e. the distance between the lateral side plate members 6 and 8. At the center of the opening 16b, a fan 16d adapted to be driven by a motor 16c is mounted. Thus, the fan 16d, when driven to rotate, causes air to flow from the front side of the heat sink 2 through the path 12 and discharged out from the rear of the heat sink 2.

Figure 2:
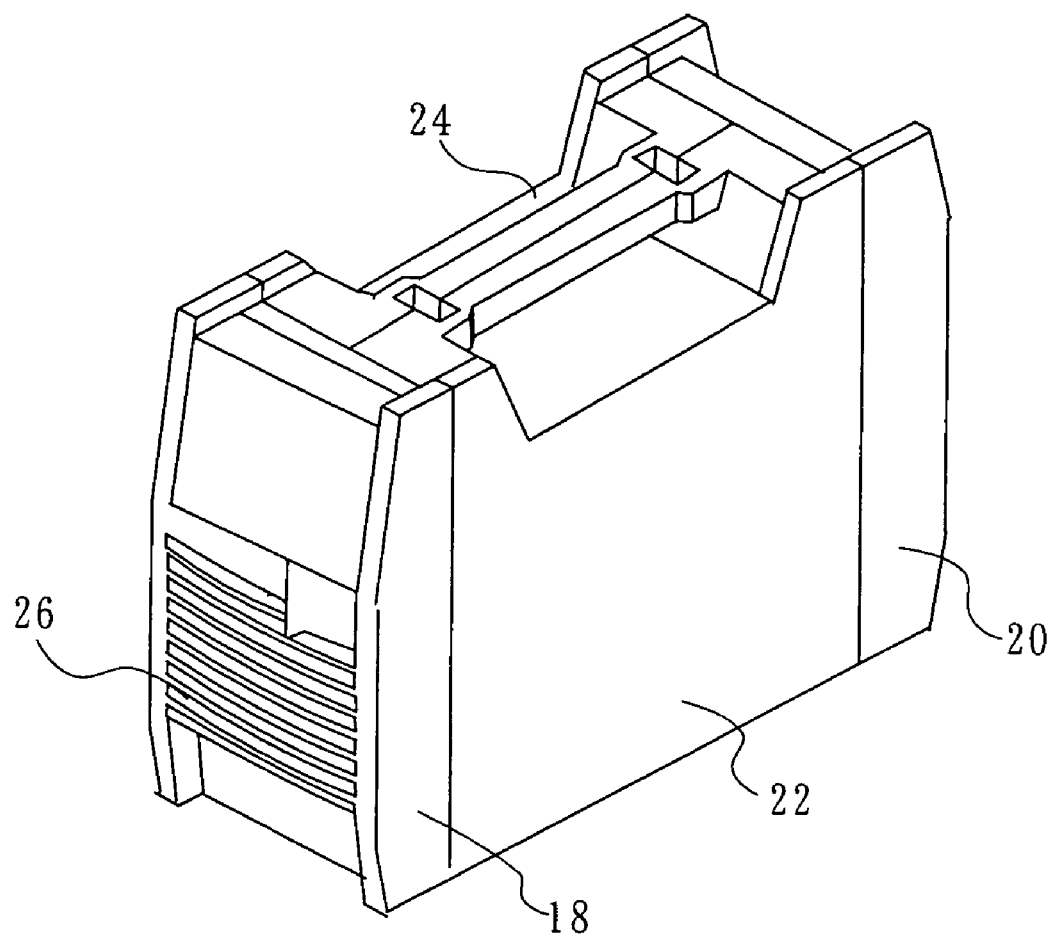
FIG. 2 is a perspective view of a case in which the cooling structure shown in FIG. 1 can be housed.

The heat sink 2 and the fan device 14 are housed in a case shown in FIG. 2. The case includes a front panel 18 and a rear panel 20 spaced from each other. The front panel 18 has ventilation openings, e.g. air intake openings 26, and similar ventilation openings, e.g. outlet openings (not shown), are formed in the rear panel 20. The fan device 14 and the heat sink 2 are disposed in such a manner that the fan device 14 is slightly spaced from the front surface of the rear panel 14 and the front surface of the heat sink 2 is slightly spaced from the rear surface of the front panel 18. Side panels 22 and 24 are disposed to cover the portions of the heat sink 2 except its front and rear side portions. The fan device 14, when operated, sucks air through the intake openings 26, which air flows through the path 12 in the heat sink 2 and is discharged out through the outlet openings. An appropriate space is disposed between the outer surface of each of the plate members 6 and 8 and the inner surface of the associated one of the side panels 22 and 24 facing the plate members 6 and 8.

A plurality of heat-generating components 28 of an electrical circuit, e.g. a power supply circuit or an active dummy load, are mounted on outer surfaces of the heat sink 2, e.g. on the outer surfaces of the plate members 6 and 8, with electrically insulating films (not shown) having good heat conductivity interposed therebetween.

Figure 3:
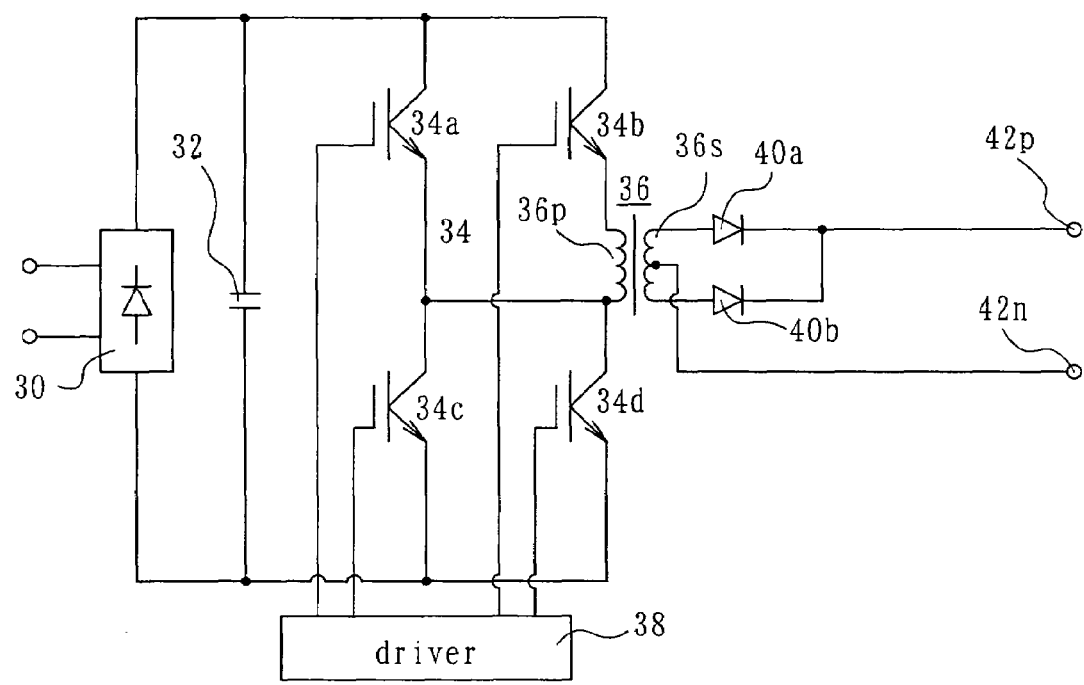
FIG. 3 is a circuit diagram of a power supply circuit with which the cooling structure shown in FIG. 1 may be used.

An example of power supply circuit is shown in FIG. 3. A voltage resulting from the rectification, by an input-side rectifier circuit 30, of an AC voltage from an AC power supply, e.g. a commercial AC power supply (not shown), is smoothed by a smoothing capacitor 32. A voltage appearing across the smoothing capacitor 32 is converted to a high-frequency voltage by an inverter 34, and the resulting high-frequency voltage is applied to a primary winding 36p of a high-frequency transformer 36. The inverter 34 includes semiconductor switching devices, e.g. IGBTs 34a, 34b, 34c and 34d, and is driven by a driver unit 38. A high-frequency voltage induced in a secondary winding 36s of the transformer 36 is rectified by output-side diodes 40a and 40b, and the resulting voltage is applied between output terminals 42p and 42n.

The input-side rectifier circuit 30, the smoothing capacitor 32, the output-side diodes 40a and 40b, and the IGBTs 34a, 34b, 34c and 34d are heat-generating components, which are shown in the drawings as the heat-generating components 28. When current is supplied to flow through the heat-generating components 28, they generate a large amount of heat, but the generated heat is conducted from the outer sides of the heat sink 2 to the inner sides, facing the path 12, and is discharged out through the outlet openings, being conveyed by the air, which is fed by the fan device 14 and is flowing through the path 12. In this manner, the temperature rise of the heat-generating components 28 is suppressed.

Each of the heat-generating components 28 has current conducting portions, e.g. live portions, more specifically, connection terminals 28a. These current conducting portions are not located on the inner side of the heat sink 2 facing the path 12, but project outward from the outer surface of the heat sink 2. Each terminal 28a has a portion covered with an insulator and an exposed portion, which is not covered with an insulator. The exposed portion is for use in checking the voltage on the heat-generating component or replacement of that component 28. As the heat-generating components 28 are not facing the path 12, their exposed portions are not facing the path 12, either, which prevents the exposed portions from being eroded by an erosive component, if any, in the air flowing through the path 12. Furthermore, since the heat-generating components 28 are not exposed to the air flowing through the path 12, electrically conductive particles, e.g. iron particles, if any, in the air flowing through the path 12 do not contact the exposed portions of the connection terminals 28a of the heat-generating components 28. Accordingly, no accidents, such as current leakage, will be caused. A layer of an oxide of stain-preventing metal, e.g. titanium, is formed over the fins 4a, 6a, 8a and 10a, which prevents dust, metal or other particles from adhering to the fins.

If exposed portions of heat-generating components are located in an area where cooling air is flowing, and if the spacing between adjacent exposed portions is 4 mm or less, current would leak due to accumulation of electrically conductive dust in the cooling air when the apparatus is used for a long time under such circumstances. For the purpose of preventing such accident, according to the embodiment being described, the heat-generating components 28 are mounted on the exterior surfaces of the heat sink 2 where the cooling air does not flow, and an insulating spacing of 6 mm or more is secured.

The driver unit 38 for driving the power supply circuit is disposed on a printed circuit board (not shown), which is disposed, being spaced from the outer surface of the heat sink 2.

Figure 4:
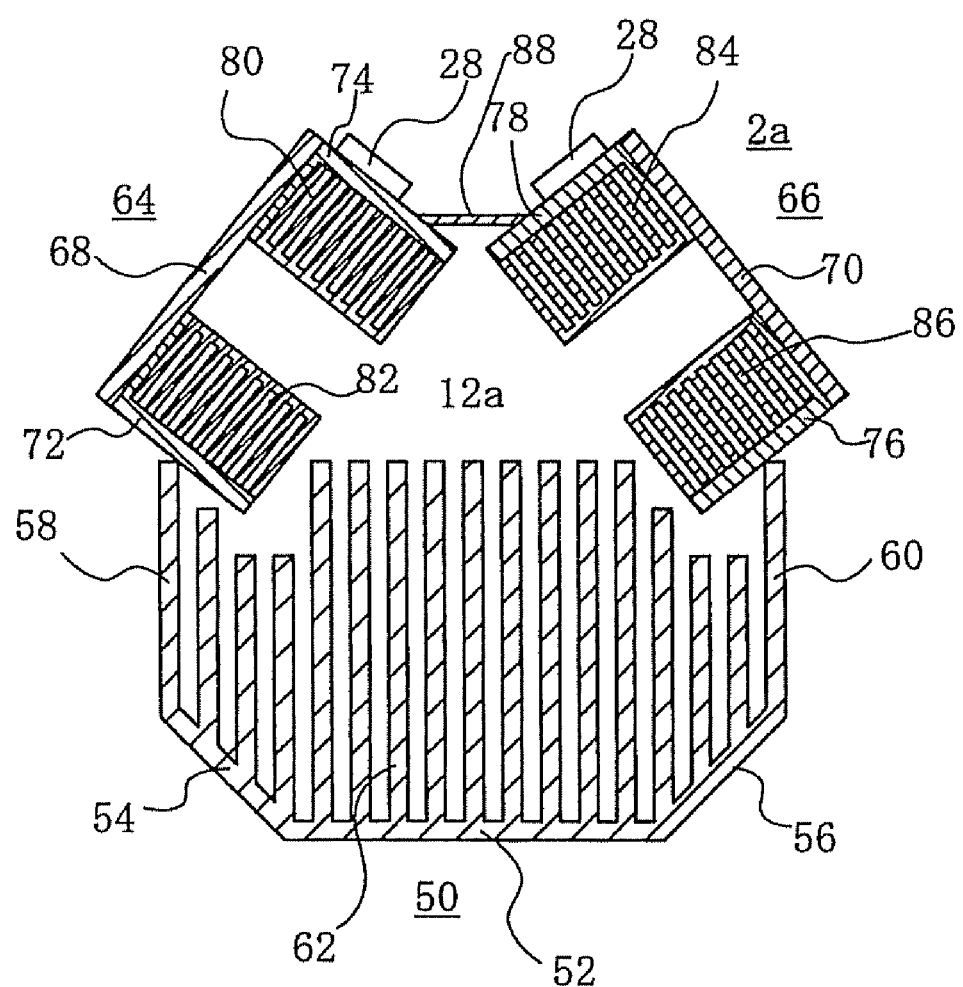
FIG. 4 shows a longitudinal cross-section of a heat-generating component cooling structure according to a second embodiment of the present invention.
Figure 5:
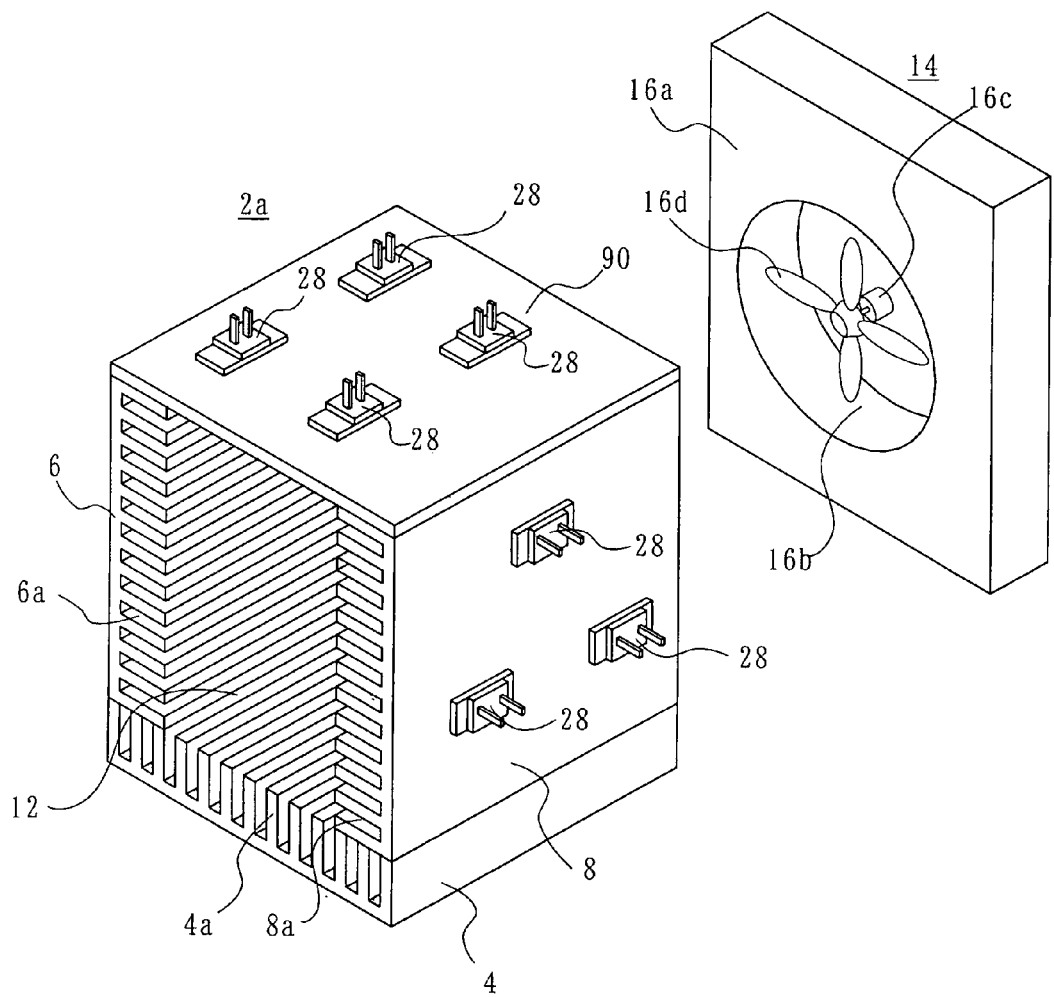
FIG. 5 is a perspective view of a heat-generating component cooling structure according to a third embodiment of the present invention.

A cooling structure according to a second embodiment of the present invention has an arrangement similar to that of the structure according to the first embodiment, except for the shape of the heat sink. The heat sink 2a of the cooling structure according to the second embodiment has a bottom unit 50, as shown in FIG. 4. The bottom unit 50 includes a bottom wall 52, slanting walls 54 and 56 extending angularly outward from the opposite edges of the bottom wall 52, and walls 58 and 60 extending from the tip ends of the slanting walls 54 and 56, respectively. The walls 58 and 60 are substantially perpendicular to the bottom wall 52. The walls 52, 54, 56, 58 and 60 extend in the length direction perpendicular to the plane of the sheet of FIG. 4. Plural fins 62 are formed to extend from the inward facing surfaces of the slanting walls 54 and 56 and bottom wall 52. The fins 62 are spaced from and in parallel with each other and also with the perpendicular walls 58 and 60. The fins 62, too, extend in the length direction perpendicular to the plane of the sheet of FIG. 4, The perpendicular walls 58 and 60 have diagonal units 64 and 66 at the respective distal ends. Each of the diagonal units 64 and 66, forming an obtuse angle with an associated one of the perpendicular walls 58 and 60, extends diagonally inward and upward so as to face a center portion of the bottom wall 52. The diagonal units 64 and 66, also extend in the length direction perpendicular to the plane of the sheet of FIG. 4, and have outward facing plate portions 68 and 70, respectively. L-shaped members, having an L-shaped cross-section, 72 and 74, and 76 and 78 are secured to the inward facing surfaces of the plate portions 68 and 70, respectively, at the opposite ends of thereof. A plurality of fins 80, 82, 84 and 86 are formed on the L-shaped members 72, 74, 76 and 78, respectively. The fins 80, 82, 84 and 86 are disposed not to contact with each other and with the fins 62. A top wall 88 closes the gap between the L-shaped members 74 and 78. The fins 62, 80, 82, 84 and 86 and the top wall 88 form the path 12 inside the heat sink 2a. The heat-generating components 28 are mounted on outer surfaces of the heat sink 2a, for example, on the outer surfaces of the L-shaped members 74 and 78 extending perpendicular to the plate members 68 and 70, respectively. The surfaces of the fins 62, 80, 82, 84 and 86 are also covered with a layer of oxide of stain-preventing metal, e.g. titanium.

With this arrangement, the heat sink 2a is hardly broken even when it receives a large impact.

A cooling structure according to a third embodiment of the invention has the same structure as the first embodiment, except for the shape of the heat sink. A heat sink 2b according to the third embodiment includes a printed circuit board 90 in place of one of the four metallic plate members forming the heat sink 2 shown in FIG. 1, e.g. the plate member 10. The printed circuit board 90 is disposed to extend between the plate members 6 and 8. The printed circuit board 90, too, includes heat-generating components 28 disposed on its outer surface.

The respective embodiments have been described as using a power supply circuit as an electrical circuit, but they may use, for example, an active dummy load, or other electrical circuits having heat-generating components. Also, the fan device 14 has been described as being spaced from the rear surface of the heat sink 2, 2a or 2b, but it may be mounted on the rear surface of the heat sink. Further, in the above-described embodiments, the front peripheral edge of the frame 16a is conformable with the rear peripheral edge of the hollow heat sink, with the central longitudinal axis of the circular opening 16b in the frame 16a being coincident with the central longitudinal axis of the path 12 in the heat sink, and with the diameter of the opening 16b being equal to the width of the path 12. However, it may be sufficient to employ only one requirement, namely, the requirement that the front peripheral edge of the frame 16a should be conformable with the rear peripheral edge of the hollow heat sink, or to employ only the other two of the requirements, namely, the requirement that the central longitudinal axis of the circular opening 16b in the frame 16a should be coincident with the central longitudinal axis of the path 12 in the heat sink, and the requirement that the diameter of the opening 16b should be equal to the width of the path 12.

The described hollow heat sink has a rectangular parallelepiped shape, but it may have a cylindrical shape.

What is claimed is:

1. A heat-generating component cooling structure comprising:
    a hollow heat sink including a portion made of a thermally conductive material, and having a path formed therein to extend therethrough from first to second end surfaces thereof;
    a fan device disposed at the first end of said heat sink adapted to cause air to flow through said path; and
    a heat-generating component mounted on said heat sink, wherein:
    said heat sink includes a bottom unit and two diagonal units formed separate from said bottom unit;
    said bottom unit includes a bottom wall and two perpendicular walls extending perpendicularly to said bottom wall from opposite sides of said bottom wall;
    said two diagonal units are disposed at respective distal ends of said two perpendicular walls, slant in respective directions away from said respective distal ends of said two perpendicular walls, and face a center portion of said bottom wall; and
    said heat-generating component is mounted on a portion other than said path and other than said bottom wall.

2. The heat-generating component cooling structure according to claim 1 wherein said heat-generating component is mounted on an outer surface of said heat sink.

3. The heat-generating component cooling structure according to claim 1 wherein fins are provided in said path in said heat sink.

4. The heat-generating component cooling structure according to claim 1 wherein a layer of oxide of stain-preventing metal is disposed over said path.

5. The heat-generating component cooling structure according to claim 1 wherein said heat-generating component has an electrically conductive portion for supplying current to said heat-generating component, said electrically conductive portion being located on an outer surface of said heat sink.

6. An electrically driven apparatus including the heat-generating component cooling structure as defined by claim 1, wherein said cooling structure is housed in a case, said case having portions facing said first and second end surfaces of said hollow heat sink, respectively, air ventilation openings being formed in said portions facing said first and second end surfaces of said heat sink.

* * * * *